United States Patent [19]

Tegel et al.

[11] Patent Number: 4,560,952
[45] Date of Patent: Dec. 24, 1985

[54] CAVITY-STABILIZED MICROWAVE OSCILLATOR

[75] Inventors: Othmar Tegel; Hardial S. Gill, both of Backnang, Fed. Rep. of Germany

[73] Assignee: ANT Nachrichtentechnik GmbH, Backnang, Fed. Rep. of Germany

[21] Appl. No.: 582,445

[22] Filed: Feb. 22, 1984

[30] Foreign Application Priority Data

Feb. 23, 1983 [EP] European Pat. Off. .... EP831017231

[51] Int. Cl.$^4$ .............................................. H03B 7/12
[52] U.S. Cl. .............................. 331/107 DP; 331/96; 333/230
[58] Field of Search .............. 331/96, 107 DP, 117 D; 333/212, 230

[56] References Cited

U.S. PATENT DOCUMENTS

| 3,308,402 | 3/1967 | Grande | 333/230 |
| 4,270,099 | 5/1981 | Gill et al. | 331/96 |

FOREIGN PATENT DOCUMENTS

| 2356445 | 6/1974 | Fed. Rep. of Germany . |
| 2710164 | 9/1978 | Fed. Rep. of Germany . |
| 2756944 | 6/1979 | Fed. Rep. of Germany . |
| 2805254 | 8/1979 | Fed. Rep. of Germany . |
| 2826767 | 3/1981 | Fed. Rep. of Germany . |

OTHER PUBLICATIONS

Craven et al., IEEE Transaction, vol. MTT-19, No. 3, Mar. 1971, pp. 295-308.
Knöchel et al., "Design of Cavity-Stabilized Microwave Oscillators", Electronics Letters, Aug. 21st, 1975, vol. 11, No. 17, pp. 405-406.
Knöchel et al., "Cavity Stabilized Oscillators with Large Tuning Range", NTZ Archiv (1979) H.1, pp. 9 to 13.
F. M. Magalhaes et al., "A Single-Tuned Oscillator for IMPATT Characterizations", Proceedings of the IEEE, May 1970, pp. 831-832.

*Primary Examiner*—Eugene R. LaRoche
*Assistant Examiner*—Robert J. Pascal
*Attorney, Agent, or Firm*—Spencer & Frank

[57] ABSTRACT

A stabilized microwave oscillator having a selected operating frequency range, composed of a rectangular waveguide dimensioned to have a cutoff frequency above the selected operating frequency range, at least one active semiconductor element and components connected for supplying a direct operating voltage to the element, mounted in the rectangular waveguide, a transmission resonator, and a coupling device coupling the rectangular waveguide to the resonator, the coupling device including a waveguide section having a length of about λ/2, where λ is the wavelength of the center frequency of the operating frequency range, and dimensioned at least in part to operate as an evanescent mode waveguide and/or a waveguide having a cutoff frequency in the vicinity of the upper end of the selected operating frequency range.

9 Claims, 4 Drawing Figures

CAVITY-STABILIZED MICROWAVE OSCILLATOR

BACKGROUND OF THE INVENTION

The present invention relates to a stabilized microwave oscillator of the type including a rectangular waveguide operated below its cutoff frequency, associated with at least one active semiconductor element connected to a direct voltage supply, a resonator and a coupling arrangement which connects the resonator to the waveguide. A resonator of this type is disclosed in Federal Republic of Germany Pat. No. 2,805,254.

Microwave oscillators including semiconductor elements, such as Gunn or IMPATT [Impact Avalanche and Transit Time] oscillators are frequently stabilized in a passive manner.

The basic principle is to couple the active semiconductor element to a high quality resonator in such a manner that, with a given constant output power, the desired stability and simple tuning is realized over the desired frequency range, as explained in a paper by R. Knochel entitled "Design of Cavity-stablised Microwave Oscillators", published in Electronic Letters, London, Aug. 21, 1975, Volume 11, No. 17, at pages 405 and 406.

Structural measures keep the resonant frequencies of such high quality stablizing circuits independent of changes in temperature as well as humidity.

Three possibilities are known for interconnecting the main circuit including the active element with the stabilizing circuit (resonator).

Reaction oscillators (e.g. described in the above-cited paper in Electronic Letters, Volume 11, No. 17): they permit high external Q factors and relatively high output power. The Q factor of the main circuit is relatively high. The Locking and tuning range is relatively narrow and one-knob tuning over a given radio frequency range ($\geq 3\%$ of the relative bandwidth) is difficult to realize. Additional suppression of the resonant frequency by the stabilizing circuit does not occur in the unlocked arrangement.

Reflection resonators (e.g. described in Federal Republic of Germany Pat. No. 2,805,254): they have a relatively large Locking and tuning range and relatively greater output powers. Their drawback is that they have a low external Q factor $Q_L$. Since the main circuit also has only poor Q factors, temperature stabilization is more difficult, and there is no suppression of the resonant frequency when the oscillator is unlocked.

Transmission resonators (e.g. described in Federal Republic of Germany Pat. No. 2,356,445 and IEEE Proceedings Letters, 1970, Vol. 58, pages 831 and 832): due to their additional transmission losses, they produce less output power, with the same semiconductor element, than the reaction or reflection resonators. They have average external Q factors $Q_L$. Their Locking and tuning range is good. Frequency changes (5 to 10% of the relative bandwidth) with single-knob tuning by detuning of a temperature compensated stabilization circuit can here be realized the easiest.

The resonant frequency of an unlocked oscillator should additionally be suppressed, if possible. In reaction and reflection resonators this may possibly be accomplished by additional monitoring and turn-off of the oscillator coupled with the monitoring so that the transmission of a wrong frequency is prevented in any case. This requires additional, often considerable, expenditures for circuitry.

SUMMARY OF THE INVENTION

It is therefore an object of the present invention to construct a microwave oscillator of the type described at the outset so that more output power is obtained therefrom with respect to an oscillator of comparable stability, and good tunability is assured.

The above and other objects are achieved, according to the invention, by the provision of a novel stabilized microwave oscillator having a selected operating frequency range, the oscillator being composed of: a rectangular waveguide dimensioned to have a cutoff frequency above the selected operating frequency range; at least one active semiconductor element and components connected for supplying a direct operating voltage to the element, mounted in the rectangular waveguide; a transmission resonator; and a coupling member coupling the rectangular waveguide to the resonator, the coupling member including a waveguide section having a length of about $\lambda/2$, where $\lambda$ is the wavelength of the center frequency of the operating frequency range, and dimensioned at least in part to operate as at least one of an evanescent mode waveguide and a waveguide having a cuttoff frequency in the vicinity of the upper end of the selected operating frequency range. Such evanescent mode waveguides are known, e.g. Craven et al, IEEE Trans, Vol. MTT-19, 1971, pp. 295–308.

Although Federal Republic of Germany Pat. No. 2,630,219 discloses, for a microwave oscillator provided with a transmission resonator for stabilization, a coupling line $\lambda/2$ in length between the resonator and the waveguide which contains the active semiconductor element, it is not possible with this oscillator, due to the existing attenuation, to obtain increased power while maintaining stability. The main difference between the oscillator disclosed in the German Pat. No. 2,630,219 and the oscillator according to the invention is that German Pat. No. 2,630,219 has its semiconductor element between the load and a stabilizing resonator, whereas the invention has a stabilizing resonator between its semiconductor element and the load and therefore reduces attenuation.

The present invention will now be described in greater detail with the aid of the drawings.

DESCRIPTION OF THE PREFERRED EMBODIMENTS

Figure 1A:
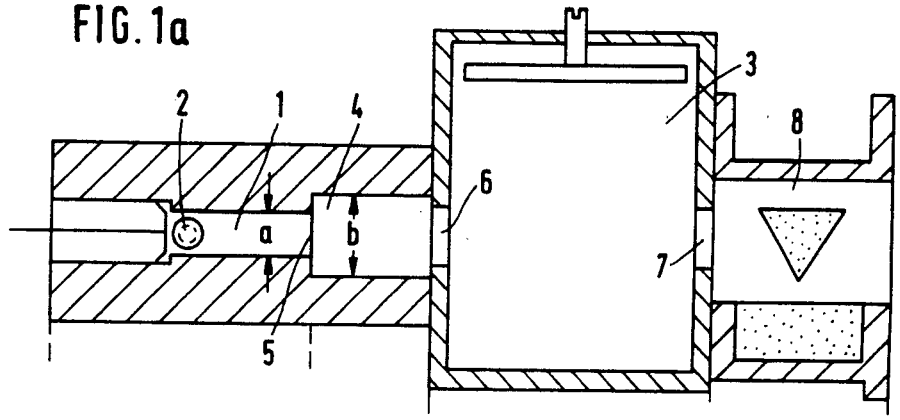
FIG. 1a is a cross-sectional plan view of a preferred embodiment of a microwave oscillator according to the invention.
Figure 1B:
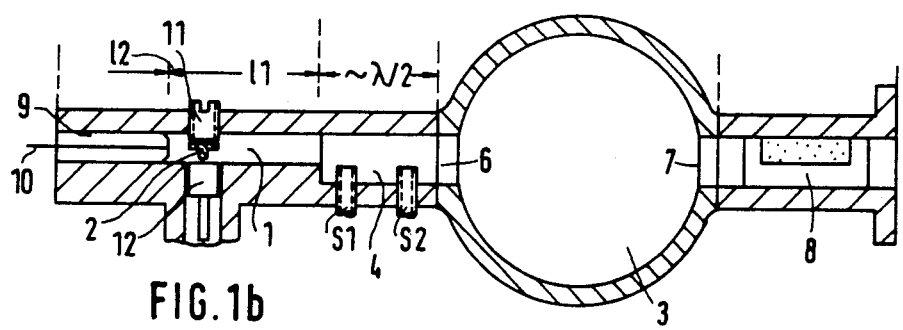
FIG. 1b is a cross-sectional elevational view of the embodiment of FIG. 1.

As shown in FIGS. 1a and 1b, the main circuit of the oscillator, as the frequency determining element, comprises a rectangular waveguide 1, which is designed as a cut off waveguide, i.e., it is operated below the limit, or cutoff, frequency of its operating frequency range. Waveguide 1 effectively has a length 11 and a width a. In the region of one end of waveguide 1, there is disposed the active semiconductor element 2, e.g. a Gunn or IMPATT diode.

Because of its high unloaded Q, a circularly cylindrical resonator of the $TE_{01q}$, preferably $TE_{012}$, mode is provided as the stabilizing resonator 3. To make the resonator insensitive to fluctuations in temperature, atmospheric pressure and humidity, it is temperature compensated and filled, for example, with a dry gas, as is known in the art.

The stabilizing factor, S, of the oscillator with unequivocal tuning characteristic is $$S = Q_L \text{ stab}/Q_L \text{ unstab}.$$

If one begins with a semiconductor element, such as a Gunn or IMPATT diode, which has given power and frequency ratings, the associated quality factor $Q_D$ of the active element is also significant because it has a great influence on the unloaded or external quality factor of the main resonator and thus on the technical characteristics of the entire oscillator.

Generally it can be stated that with increasing power and frequency the quality factor of the active element increases, which automatically leads to a higher unstabilized Q factor, $Q_L$ unstab., for a given circuit arrangement.

The coupling means 4 between resonator 3 and cutoff waveguide 1 comprises a waveguide section of a length of about λ/2, and a width b, and is designed at least in part as an evanescent mode waveguide and/or as a waveguide which is operated near its limit, or cutoff, frequency, and which may be a rectangular waveguide. A cutoff waveguide, waveguide 1, is understood to mean a waveguide that is operated considerably below the limit frequency. An evanescent mode waveguide, waveguide section 4, is understood to mean a waveguide that is operated close to its cutoff frequency, below or above cutoff. For the $TE_{10}$ mode, the following applies: $\lambda_c = 2a$. The cutoff frequency $\lambda_c$ is chosen to be 0.7 $\lambda_0$ is given by the oscillator frequency. The dimensions of this evanescent mode waveguide section 4 are selected so that its cutoff frequency lies near the operating frequency. It has been found to be advantageous, to dimension waveguide section 4 in such a way that its cutoff frequency lies close to, for example 1 to 10%, below or above the upper end of the operating frequency range. Waveguide section 4 takes care that there is an optimum connection of the cutoff waveguide 1, i.e. the main circuit, with the stabilizing resonator 3 and exerts considerable influence on the characteristics of the entire oscillator, particularly on its output power, stabilization factor S, pulling and Locking range and build-up behavior.

Waveguide section 4 may be dimensioned as an evanescent waveguide over its entire length or only over parts thereof.

The transition from a rectangular waveguide 1 operated below the cutoff frequency to the waveguide section 4 which at least in part is designed as an evanescent mode waveguide is effected by means of a TEITM jump 5; i.e., the wider dimension of waveguide 1 is equal to the narrower dimension of waveguide section 4. Waveguide section 4 may also have other jumps. An aperture 6 serves to couple in waves between waveguide section 4 and resonator 3. A similar aperture 7 is provided on the opposite side of resonator 3. An isolator 8 known in the art connected thereto serves to decouple the oscillator from the load. Since the waves from resonator 4 are coupled out not by way of aperture 6 but by way of a separate aperture 7, resonator 3 is a transmission resonator. This makes possible additional suppression of the wave in the unlocked state.

In order attenuate undesirable resonances, additional damping components may be inserted into waveguide section 4. In order to change the coupling between the main circuit, waveguide 1, and the stabilizing circuit, resonator 3, the coupling means, evanescent mode, waveguide section 4, may comprise one or a plurality of tuning pins S1, S2, for example tuning screws. These matching pins S1 and S2 should preferably be arranged with a spacing of about λ/8 or λ/4. Matching pins S1 and S2 may have a distance from the ends of waveguide section 4 of about λ/8 respectively, if the distance between S1 and S2 is λ/4. Waveguide section 4 is then operated nearly above cutoff.

At the input end of the cutoff waveguide 1, i.e. at the connecting end opposite waveguide section 4, there is disposed a further cutoff waveguide 9. It includes a shortcircuit plunger 10, which imparts a variable inductance behavior to the waveguide. This further cutoff waveguide 9 may have dimensions which are the same as or different from cutoff waveguide 1 in the diode zone. For example, waveguide 9 may have a circular cross-section, with the short circuit plunger 10 being formed by a contact making screw. The effective length of the further cutoff waveguide 9 is identified as 12. In this arrangement, the configuration of the cutoff waveguide 1 in the immediate vicinity of semiconductor element 2 as well as the configuration of the d.c. voltage input structure are also of importance. The direct voltage is supplied via a single or multicircuit coaxial blocking filter 12, which may be a plunger and is shown in FIG. 3.

Depending on the type of semiconductor element 2 employed, the direct voltage supply may be provided from constant sources, current sources or voltage sources. The current supplies may additionally contain limiting circuits and circuits which improve the build-up behavior of the oscillator.

For the transmission of signals, the passively stabilized oscillator may be modulated by the current or the voltage of the semiconductor device.

Figure 2:
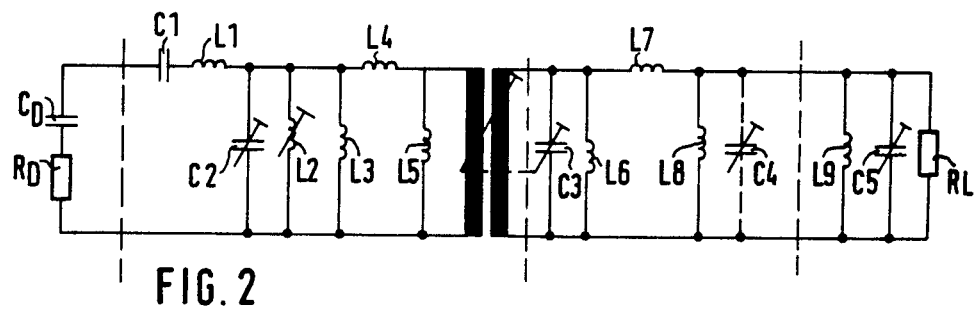
FIG. 2 is an electrical equivalent circuit diagram for the microwave oscillator of FIGS. 1.
Figure 3:
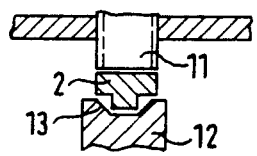
FIG. 3 is a cross-sectional detail view of a special diode mount for the embodiment of FIGS. 1.

For mounting of semiconductor element 2, waveguide 1 is provided with a screw pin 11, shown in FIGS. 1b and 3, which can be pressed against semiconductor element 2 to make contact, and a plunger 12 through which the semiconductor element 2 receives direct voltage potential. In the region of semiconductor element 2, waveguide 1 may be specially shaped, as by being provided with bars. Moreover, plunger 12 may have a special shape at its end facing the side of the semiconductor element, such as by being provided with an indentation 13 as shown in FIG. 3. These measures result in waveguide 1 having dual or multicircuit resonant behavior with subcritical coupling. FIG. 2, the electrical equivalent circuit diagram, shows dual resonant behavior. Multicircuit behavior can be achieved by inserting additional tuning screws in the cutoff waveguide 1.

The dimensioning of waveguides 1 and 4 determines the real part transformation and the coupling to the stabilizing circuit. The use of cutoff waveguides and evanescent mode waveguides for waveguides 1 and 4 is advantageous insofar as the behavior of these lines in the HF range is the same as that of lumped elements. Moreover, losses are low and the circuits are broadbanded, since, for example, no parasitic reactive elements occur during installation of the diodes.

No periodic relationship exists between reactance and frequency. The propagation constant $\gamma_e$ of the fundamental mode (decaying TE$_{10}$ mode) is real, the characteristic impedance is positively imaginary ($Z_o = jX_o$). Most obstacles in evanescent mode waveguide are inductances. Screws or posts which form a slit and thin diaphragms of dielectric material are the exception. They act as capacitances. Because of its good quality, a resonator of the TE$_{Oq}$ type is preferably employed for stabilizing circuit 3.

The equivalent circuit diagram for the oscillator of FIGS. 1 is shown in FIG. 2.

$C_D$ and $R_D$ form the simplified equivalent circuit diagram for semiconductor element 2. C1, L1, and C2 are determined by the type of diode mount. The configuration of the diode side end of blocking filter 12 here plays an important part. L$_2$ is determined by the dimensions of line 9 and the position of the short circuit piston 10 ($XL_2 = jX_o \tan h\ \gamma_e l 2$. In the illustrated equivalent circuit diagram, the diode, C1, L1, C2 and L2 form a subcritically to critically coupled dual circuit filter. This arrangement may also be designed to operate in a multicircuit mode as mentioned before. L3, L4, L5 and the transformer are dimensioned in conjunction with the TEITM jump to waveguide section 4 essentially with respect to the real part transformation ($XL_4 = jX_o \sin h\ \gamma_e l 1$, $XL_3$ and $XL_5 = jK_o \cot h\ \gamma_e l 1$). C3 is determined by tuning screw S1. It additionally permits a change in the real part transformation if it has a suitable diameter and is spaced from the TE/TM jump ("HE Step").

Waveguide section 4 is formed by L6, L7, and L8. If it is designed as an evanescent mode waveguide, it, in principle, likewise has the above indicated dependency. C4 is determined by tuning screw S2.

L9 and C5 constitute stabilizing circuit 3. The behavior of these circuits is of course not the same as that of lumped elements (TE$_{01q}$ resonance). The equivalent circuit diagram does not show the isolator 8 because its influence on other components used is very low. Isolators for this purpose are well known. The isolator shown in FIG. 1 is a well known circulator with ferrite material - dotted region. The load resistance is indicated by RL.

An oscillator according to the invention designed for a radio link equipment in a radio frequency range from 14.5 to 15.35 GHz, when used with a GaAs IMPATT diode having an output power of 2 to 2.5 Watt, attained a total efficiency of more than 5%. Its frequency stability was better than $\pm 5 \cdot 10^{-5}$. This corresponds to a stability of $6.25 \cdot 10^{-7}$/°C. for an ambient temperature range from $-25°$ C. to $+55°$ C. and a relative humidity range from 10 to 90%.

As for damping means any suitable microwave absorbing material known could be used, e.g. carbon mixed with plaster or carbon containing foils attached to the inner walls of the waveguide.

It will be understood that the above description of the present invention is susceptible to various modifications, changes and adaptations, and the same are intended to be comprehended within the meaning and range of equivalents of the appended claims.

What is claimed is:

1. A stabilized microwave oscillator having a selected operating frequency range, comprising:
    a rectangular waveguide dimensioned to have a cutoff frequency above the selected operating frequency range;
    at least one active semiconductor element and means connected for supplying a direct operating voltage to said element, mounted in said rectangular waveguide;
    means defining a transmission resonator;
    coupling means coupling said rectangular waveguide to said resonator, said coupling means comprising a waveguide section having a length of about $\lambda/2$, where $\lambda$ is the wavelength of the center frequency of the operating frequency range, and said waveguide section being dimensioned so that at least part of said waveguide section operates as an evanescent mode waveguide; and
    means mounting said semiconductor element in said rectangular waveguide; and
    wherein said element and said mounting means together constitute switching means for causing said rectangular waveguide to exhibit plural circuit resonance behavior with subcritical coupling.

2. An arrangement as defined in claim 1 wherein said coupling means further comprise means defining a TE/TM jump located to constitute the transition between said rectangular waveguide and said waveguide section.

3. An arrangement as defined in claim 2 wherein said coupling means further comprise damping means disposed in said waveguide section.

4. An arrangement as defined in claim 1 wherein said coupling means further comprise at least one tuning pin mounted in said waveguide section.

5. An arrangement as defined in claim 4 wherein there are two said tuning pins mounted in said waveguide section.

6. An arrangement as defined in claim 5 wherein said tuning pins are spaced $\lambda/8$ or $\lambda/4$ apart.

7. An arrangement as defined in claim 4 wherein said coupling means further comprise damping means disposed in said waveguide section.

8. An arrangement as defined in claim 1 wherein said coupling means further comprise damping means disposed in said waveguide section.

9. An arrangement as defined in claim 1 further comprising: a further waveguide dimensioned to operate as a cutoff waveguide with respect to the selected operating frequency range and coupled to said rectangular waveguide at the end of said rectangular waveguide remote from said coupling means; and a short-circuit plunger movably mounted in said further waveguide for adjusting the inductance behavior of said further waveguide.

* * * * *